United States Patent
Tsuzuki et al.

(10) Patent No.: US 7,498,634 B2
(45) Date of Patent: Mar. 3, 2009

(54) SEMICONDUCTOR DEVICE HAVING IGBT AND DIODE

(75) Inventors: Yukio Tsuzuki, Nukata-gun (JP); Norihito Tokura, Okazaki (JP)

(73) Assignee: DENSO CORPORATION, Kariya (JP)

( * ) Notice: Subject to any disclaimer, the term of this patent is extended or adjusted under 35 U.S.C. 154(b) by 36 days.

(21) Appl. No.: 11/649,367

(22) Filed: Jan. 4, 2007

(65) Prior Publication Data
US 2007/0170549 A1    Jul. 26, 2007

(30) Foreign Application Priority Data
Jan. 10, 2006    (JP)    .............................. 2006-002874
Nov. 30, 2006    (JP)    .............................. 2006-322900

(51) Int. Cl.
*H01L 29/76*    (2006.01)

(52) U.S. Cl. ........................ 257/341; 257/133; 257/146; 257/343; 257/E29.027

(58) Field of Classification Search ................. 257/341, 257/133, 146, 343, 370, E29.182, E29.202, 257/E29.027

See application file for complete search history.

(56) References Cited

U.S. PATENT DOCUMENTS 5,547,889 A    8/1996    Kim
5,574,299 A    11/1996    Kim (Continued)

FOREIGN PATENT DOCUMENTS

JP    A-2003-101019    4/2003

OTHER PUBLICATIONS

Kim et al., *High-density trench gate DMOSFET's with trench contact structure*, Electronic Letters, vol. 40, No. 11, May 27, 2004.

(Continued)

*Primary Examiner*—Zandra Smith
*Assistant Examiner*—Tsz K Chiu
(74) *Attorney, Agent, or Firm*—Posz Law Group, PLC (57) ABSTRACT

A semiconductor device includes: a substrate having a first side and a second side; an IGBT; and a diode. The substrate includes a first layer, a second layer on the first layer, a first side N region on the second layer, second side N and P regions on the second side of the first layer, a first electrode in a first trench for a gate electrode, a second electrode on the first side N region and in a second trench for an emitter electrode and an anode electrode, and a third electrode on the second side N and P regions for a collector electrode and a cathode. The first trench penetrates the first side N region and the second layer, and reaches the first layer. The second trench penetrates the first side N region, and reaches the second layer.

26 Claims, 8 Drawing Sheets

U.S. PATENT DOCUMENTS

| | | |
|---|---|---|
| 5,751,024 A | 5/1998 | Takahashi |
| 6,365,932 B1 | 4/2002 | Kouno et al. |
| 6,437,399 B1 | 8/2002 | Huang |
| 6,460,994 B1 | 10/2002 | Nolan |
| 6,495,871 B2 | 12/2002 | Hattori et al. |
| 6,501,146 B1 | 12/2002 | Harada |
| 6,670,658 B2 | 12/2003 | Hattori et al. |
| 6,825,105 B2 | 11/2004 | Grover et al. |
| 6,888,196 B2 | 5/2005 | Kobayashi |
| 6,894,347 B2 | 5/2005 | Hattori et al. |
| 6,921,687 B2 | 7/2005 | Hattori et al. |
| 6,979,874 B2 | 12/2005 | Harada |
| 6,998,678 B2 | 2/2006 | Werner et al. |
| 2004/0144992 A1 | 7/2004 | Willmeroth et al. |
| 2005/0017290 A1 | 1/2005 | Takahashi et al. |
| 2005/0045960 A1 | 3/2005 | Takahashi |
| 2005/0218472 A1 | 10/2005 | Okada et al. |

OTHER PUBLICATIONS

Matsumoto et al., *A High-Performance Self-Aligned UMOSFET With a Vertical Trench Contact Structure*, IEEE Transactions on Electron Devices, vol. 41, No. 5, May 1994.

Matsuzawa et al., *A Unified Simulation of Schottky abd Ohmic Contacts*, IEEE Transactions on Electron Devices, vol. 47, No. 1, Jan. 2008.

Office Action dated Jul. 11, 2008 in corresponding DE application No. 10 2007 001 031.3 (and English Translation).

SEMICONDUCTOR DEVICE HAVING IGBT AND DIODE

CROSS REFERENCE TO RELATED APPLICATIONS

This application is based on Japanese Patent Applications No. 2006-2874 filed on Jan. 10, 2006, and No. 2006-322900 filed on Nov. 30, 2006, the disclosures of which are incorporated herein by reference.

FIELD OF THE INVENTION

The present invention relates to a semiconductor device having an IGBT and a diode.

BACKGROUND OF THE INVENTION

An inverter circuit for driving a load such as a motor is a converter for switching a direct current and an alternating current. Thus, the converter converts a direct voltage to an alternating voltage so that the inverter circuit supplies electricity to the load. The inverter circuit for driving an inductive type motor includes an IGBT (i.e., insulated gate bipolar transistor) and a FWD (i.e., free wheel diode). The IGBT provide s switching device. The FWD bypasses the current flowing through the motor when the IGBT turns off so that the FWD controls the current flowing through the motor to be constant against switching operation of the IGBT. Specifically, the IGBT electrically coupled between a direct current supply and the motor so that a predetermined voltage is applied to the motor. When the IGBT turns off, the current flowing through the motor flows back to the direct current supply through the FWD because of energy accumulated in a reactance L of the motor. Thus, an inverse direct voltage is applied to the motor. Thus, the switching operating of the IGBT provides to energize the alternating voltage from the direct current supply without rapidly shutting the current flowing through the motor. Since the inverter circuit provides these operations, it is necessary to provide the FWD inversely connecting in parallel to the IGBT. Thus, a pair of the FWD and the IGBT is formed, so that the IGBT and the FWD are inversely connected each other in series.

Figure 8:
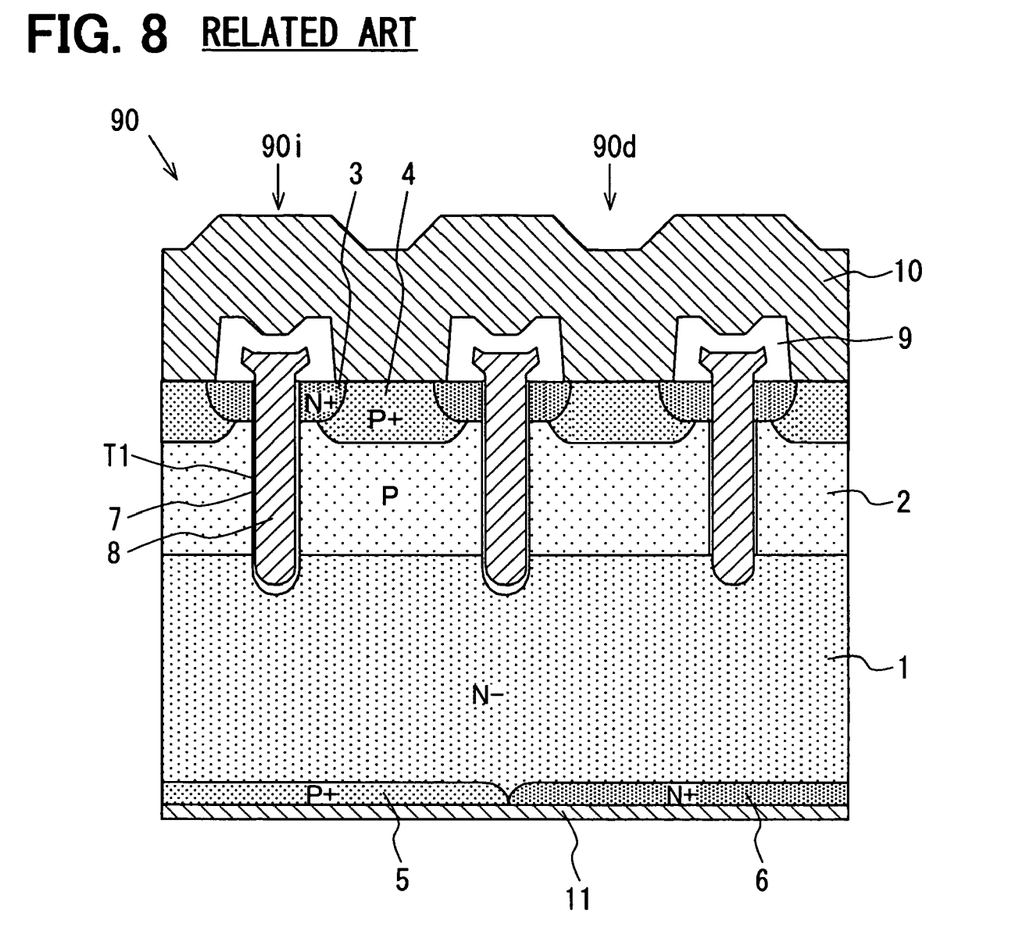
FIG. 8 is a cross sectional view showing a semiconductor device according to a comparison of the preferred embodiment of the present disclosure.
Figure 9:
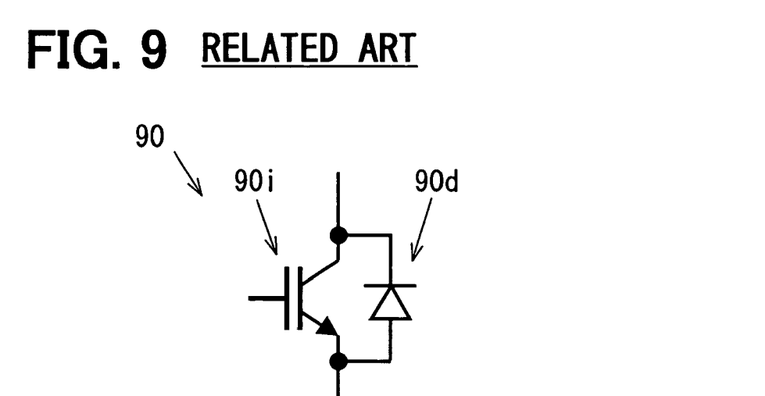
FIG. 9 is a circuit diagram showing an equivalent circuit of the device shown in FIG. 8.

FIG. 8 shows an example of a semiconductor device 90 as a comparison of the present disclosure. The device is used for an inverter circuit to drive a load such as a motor. The device includes an IGBT cell and a diode cell, which are formed in a same semiconductor substrate. FIG. 9 shows an equivalent circuit of the device 90 in FIG. 8.

The device 90 includes a N⁻ conductive type semiconductor substrate 1 having a principal surface. A P conductive type layer 2 is formed in a surface portion of the substrate 1 on the principal surface side. A principal surface side N conductive type region 3 (i.e., principal N region) having a high impurity concentration and a principal surface side high impurity concentration P conductive type region 4 (i.e., principal P region) having a high impurity concentration are formed in a surface portion of the P conductive type layer 2. Further, a backside P conductive type region 5 (i.e., backside P region) having a high impurity concentration and a backside N conductive type region 6 (i.e., backside N region) having a high impurity concentration are formed in a surface portion of the substrate 1 on the backside.

A trench T1 is formed in the device 90. The trench T1 penetrates the principal surface side N conductive type region 3 and the P conductive type layer 2, and reaches the N⁻ conductive type semiconductor substrate 1.

A first electrode layer 8 made of poly silicon is disposed in the trench T1 through an insulation film 7, which is formed on an inner wall of the trench T1. The first electrode layer 8 provides a gate electrode of the IGBT cell 90*i*. A second electrode layer 10 made of aluminum is formed on the principal surface of the substrate 1 through an interlayer insulation film 9. The second electrode layer 10 is electrically connected to the P conductive type layer 2 through the principal surface side N conductive type region 3 and the principal surface side high impurity concentration P conductive type region 4. The second electrode layer 10 provides an anode electrode of the diode cell 90*d* and the emitter electrode of the IGBT cell 90*i*. A third electrode layer 11 is formed on the backside of the substrate 1, and electrically connected to the backside P conductive type region 5 and the backside N region 6. The third electrode layer 11 provides the collector electrode of the IGBT cell 90*i* and the cathode electrode of the diode cell 90*d*.

Thus, in the device 90, the principal N region 3 provides the emitter region of the IGBT cell 90*i*, the P conductive type layer 2 provides the channel layer of the IGBT cell 90*i*, and the backside P region 5 provides the collector region of the IGBT cell 90*i*. Further, the boundary between the substrate 1 and the P conductive type layer 2 provides a PN junction of the diode cell 90*d*, the principal P region 4 provides the anode region of the diode cell 90*d*, and the backside N region 6 provides the cathode region of the diode cell 90*d*. As shown in FIG. 9, in the device 90, the IGBT cell 90*i* and the diode cell 90*d* are electrically connected in parallel to each other.

When the diode 90*d* in the device 90 is used as the FWD in the inverter circuit, a current waveform is important when the diode is inversely recovered in a case where the diode switches from an on-state to an off-state.

Figure 10A:
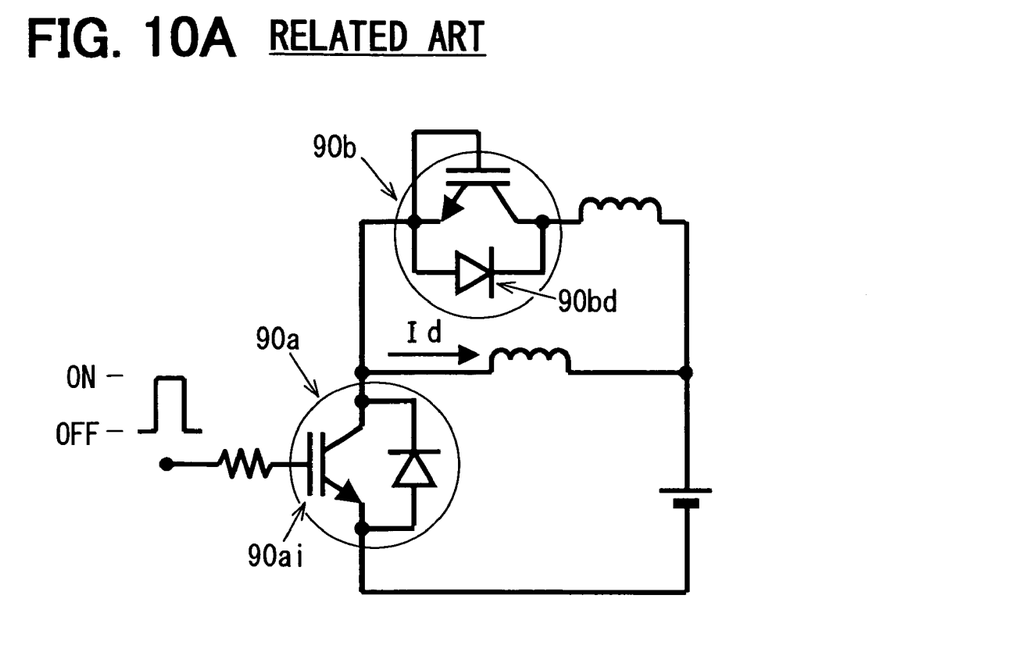
FIG. 10A is a circuit diagram showing a test circuit for detecting a current waveform in the device in FIG. 9.
Figure 10B:
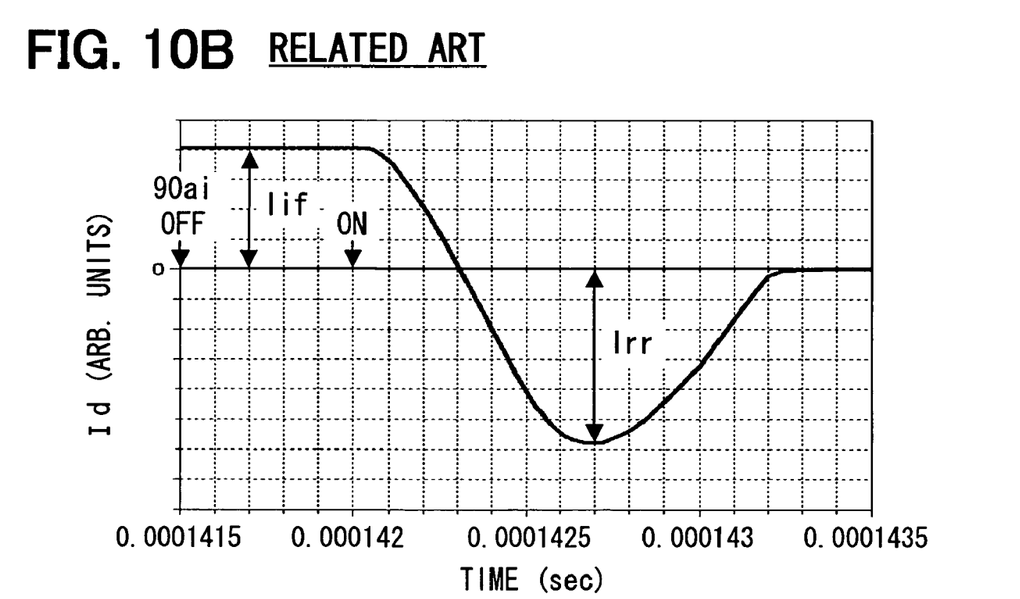
FIG. 10B is a graph showing a relationship between a time and a current in the diode cell in the device in FIG. 9.

FIG. 10A shows an evaluation circuit for measuring the current waveform of the current flowing through the diode 90*d*. FIG. 10B is a sample of the current waveform.

Two semiconductor devices 90*a*, 90*b* have the same structure as the device 90 shown in FIG. 8. The IGBT cell 90*ai* in the first device 90*a* provides a switching device, and the current Id flowing through the diode cell 90*bd* in the second device 90*b* is detected when the IGBT in the second device 90*b* short-circuits.

As shown in FIG. 10B, when the IGBT 90*ai* in the first device 90*a* turns off, a circulation current Iif flows in the diode 90*bd* of the second device 90*b*. When the IGBT cell 90*ai* of the first device 90*a* turns on, a reverse current instantaneously flows in the diode 90*bd* pf the second device 90*b*. The reverse current flowing in an opposite direction to the circulation current Iif has a peak current, which is defined as a recovery current Irr. In case of reverse recovery, the power supply voltage is applied to the diode, and a product of the voltage by the current is defined as a recovery loss. In general, it is required for a rectifier diode to have a small recovery current Irr, a small recovery loss in case of a reverse recovery process, and soft recovery of the current in case of the reverse recovery process.

In the device 90 shown in FIG. 8, the diode cell 90*d* functions as a FWD having a PN junction of a boundary between the P conductive type layer 2 and the substrate 1 in the IGBT cell 90*i*. Thus, the diode cell 90*d* is formed together with the IGBT cell 90*i*. The diode cell 90*d* has a high impurity concentration of the P conductive type layer 2, which corresponds to a P conductive type portion of the FWD. Thus, when the diode cell 90*d* functions with forward operation, a hole is introduced with high impurity concentration, so that the recovery current Irr becomes larger in case of the recovery operation. Accordingly, recovery performance becomes low.

To improve the recovery performance of the diode cell 90d, it is preferred that a surface pattern, an impurity concentration profile, or a life time in the diode is optimized in case of a single high speed diode. However, since the diode cell 90d is formed together with the IGBT cell 90i, structure change such as the above optimization for improving the diode performance may deteriorate the performance of the IGBT cell 90i. Thus, it is difficult to improve the diode performance.

To improve the diode performance without reducing the performance of the IGBT cell 90i, a semiconductor device is disclosed in JP-A-2005-101514 (corresponding to US Patent Publication No. 2005-0045960).

Figure 11:
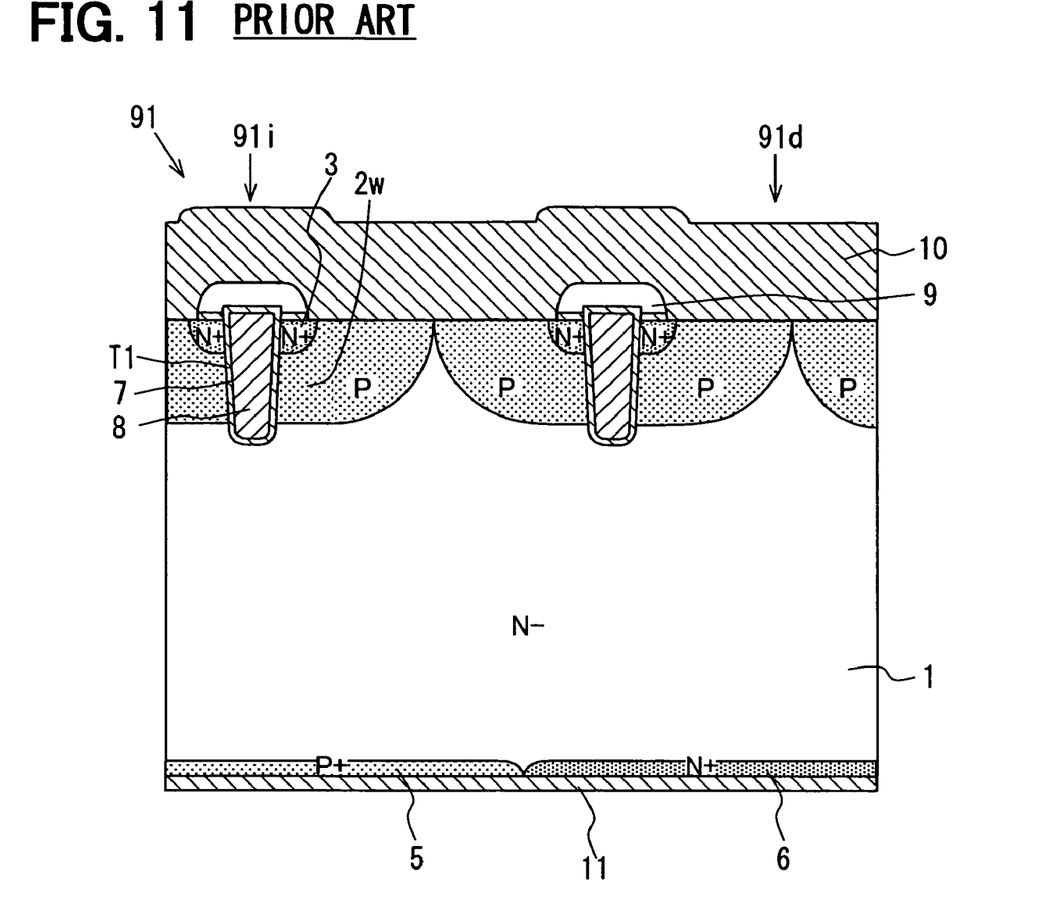
FIG. 11 is a cross sectional view showing a semiconductor device according to a prior art.

FIG. 11 shows the semiconductor device 91 in US Patent Publication No. 2005-0045960.

In the device 91, the channel region of the IGBT cell 91i is provided by the P conductive type region 2w, which is formed by diffusing in a horizontal direction. The PN junction of the diode cell 91d is formed between the N conductive type semiconductor substrate 1 and the P conductive type region 2w, which expands in the horizontal direction of the substrate 1. Specifically, the PN junction is disposed at a boundary between an end of the P conductive type region 2 in the horizontal direction and the substrate 1. The end of the P conductive type region 2 in the horizontal direction has a comparative low impurity concentration, so that an introduced hole concentration is reduced in case of a forward operation of the diode cell 91d. Thus, the recovery performance is improved.

The device 91 shown in FIG. 11 includes no principal P region 4, although the device 90 in FIG. 8 includes the principal P region 4. The P conductive type region 2w in the device 91 has a surface impurity concentration, which is lower than that of the P conductive type region 2 in the device 90. In this case, a parasitic PNP transistor has a large base resistance, which is provided by a pinch resistance of the P conductive type channel (i.e., the P conductive type region 2w). Here, the parasitic PNP transistor is composed of the principal N region 3, the P conductive type region 2w and the substrate 1. Thus, current amplification factor of the parasitic NPN transistor becomes larger. In this case, when a high voltage surge is applied to the device 91, and an avalanche current flows in the P conductive type region 2w, the parasitic NPN transistor easily functions so that the device 91 may be broken by the high voltage surge. Accordingly, although the recovery performance of the diode cell 91d is improved, breakdown energy is small so that the device 91 has a small surge withstand voltage.

Thus, it is required for a semiconductor device to have sufficient performance of the IGBT cell and sufficient recovery performance of the diode cell with a sufficient surge withstand voltage.

SUMMARY OF THE INVENTION

In view of the above-described problem, it is an object of the present disclosure to provide a semiconductor device having an IGBT and a diode.

According to a first aspect of the present disclosure, a semiconductor device includes: a substrate having a first side and a second side; an IGBT disposed in the substrate; and a diode disposed in the substrate. The substrate includes a first layer having a first conductive type, a second layer having a second conductive type, a first side first conductive type region, a second side first conductive type region and a second side second conductive type region. The second layer is disposed on the first side of the first layer, and has an impurity concentration, which is reduced from the first side of the second layer to the second side of the second layer. The first side first conductive type region is disposed on the first side of the second layer. The second side first conductive type region and the second side second conductive type region are disposed on the second side of the first layer. The second side first conductive type region is adjacent to the second side second conductive type region. The substrate further includes a first trench, a second trench, a first electrode, a second electrode and a third electrode. The first electrode is embedded in the first trench through an insulation film. The first trench penetrates the first side first conductive type region and the second layer, and reaches the first layer. The first electrode provides a gate electrode of the IGBT. The second electrode is disposed on the first side first conductive type region so that the second electrode is electrically coupled with the first side first conductive type region. The second trench penetrates the first side first conductive type region, and reaches the second layer. The second trench is filled with the second electrode so that the second electrode is electrically coupled with the second layer. The second electrode provides an emitter electrode of the IGBT and an anode electrode of the diode. The third electrode is disposed on the second side first conductive type region and the second side second conductive type region so that the third electrode is electrically coupled with the second side first conductive type region and the second side second conductive type region. The third electrode provides a collector electrode of the IGBT and a cathode of the diode.

In the above device, the second layer provides a channel of the IGBT and a P conductive portion of the diode. The device has sufficient IGBT performance and sufficient surge withstand voltage. Further, the second layer connecting to the anode of the diode has the impurity concentration, which is reduced from the surface portion to the inside of the second layer. Thus, an introduced hole concentration is reduced in case of forward operation, so that a recovery current in case of reverse recovery process becomes small. Thus, the recovery loss in the device is reduced so that the recovery characteristics are improved.

According to a second aspect of the present disclosure, a semiconductor device includes: a substrate having a first side and a second side; an IGBT disposed in the substrate; and a diode disposed in the substrate. The substrate includes a first layer having a first conductive type, a second layer having a second conductive type, a first side first conductive type region, a second side first conductive type region and a second side second conductive type region. The second layer is disposed on the first side of the first layer, and has an impurity concentration, which is reduced from the first side of the second layer to the second side of the second layer. The first side first conductive type region is disposed on the first side of the second layer. The second side first conductive type region and the second side second conductive type region are disposed on the second side of the first layer. The second side first conductive type region is adjacent to the second side second conductive type region. The substrate further includes a first trench, a second trench, a first electrode, a second electrode and a third electrode. The first electrode is embedded in the first trench through an insulation film. The first trench penetrates the first side first conductive type region and the second layer, and reaches the first layer. The first electrode provides a gate electrode of the IGBT. The second electrode is disposed on the first side first conductive type region so that the second electrode is electrically coupled with the first side first conductive type region. The second trench penetrates the first side first conductive type region, and reaches the second layer. The second trench is filled with the second electrode so that the second electrode is electrically coupled with the second layer. The second electrode provides an emitter electrode of the IGBT and a cathode electrode of the diode. The third electrode is disposed on the second side first conductive type region and the second side second conductive type region so that the third electrode is electrically coupled with the second side first conductive type region and the second side second conductive type region. The third electrode provides a collector electrode of the IGBT and an anode of the diode.

In the above device, the second layer provides a channel of the IGBT and an N conductive portion of the diode. The device has sufficient IGBT performance and sufficient surge withstand voltage. Further, the second layer connecting to the cathode of the diode has the impurity concentration, which is reduced from the surface portion to the inside of the second layer. Thus, an introduced hole concentration is reduced in case of forward operation, so that a recovery current in case of reverse recovery process becomes small. Thus, the recovery loss in the device is reduced so that the recovery characteristics are improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
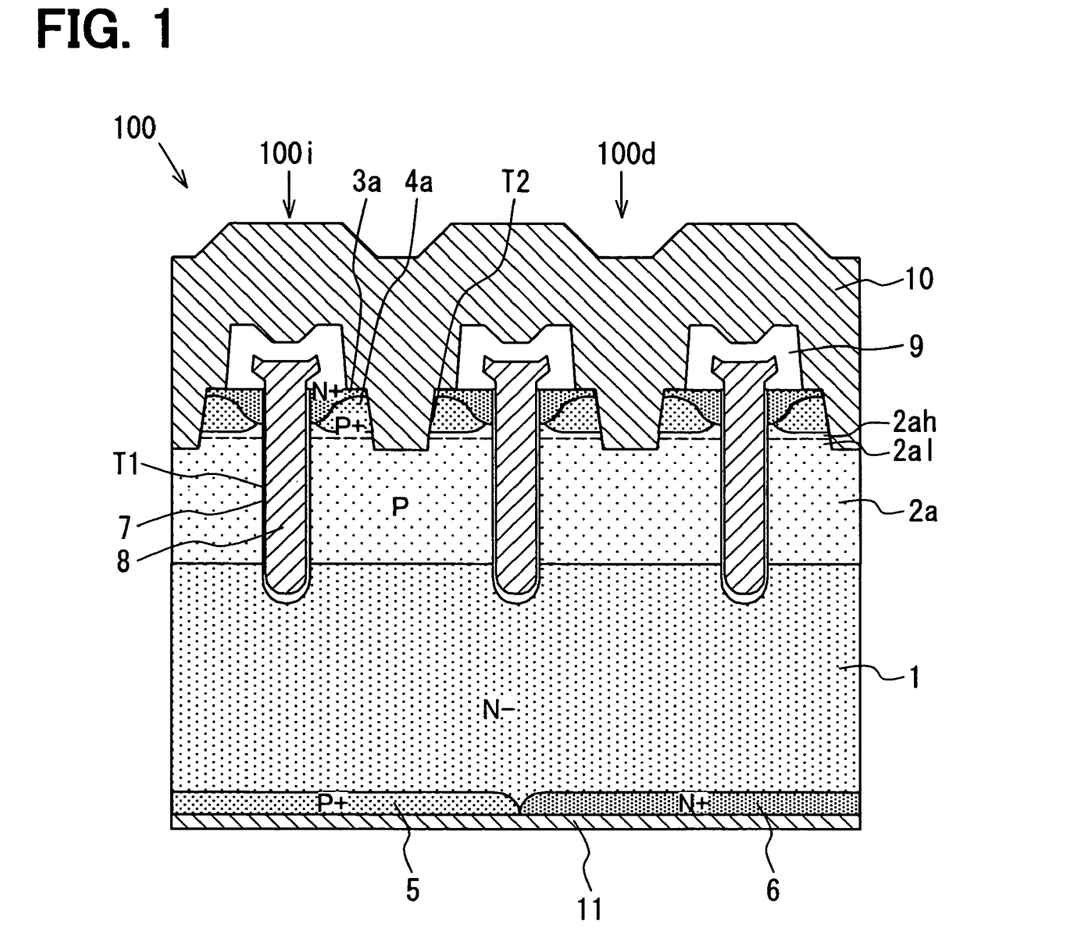
FIG. 1 is a cross sectional view showing a semiconductor device according to a preferred embodiment of the present disclosure.

FIG. 1 shows a semiconductor device 100 according to a preferred embodiment. The device 100 includes an IGBT cell 100$i$ and a diode cell 100$d$, which are formed in a same semiconductor substrate 1. The device 100 includes a N$^-$ conductive type semiconductor substrate 1 having a principal surface and a backside surface. A P conductive type layer 2$a$ is formed on the principal surface of the substrate 1, and an impurity concentration of the P conductive type region 2$a$ is gradually reduced from a surface portion to an inner portion. A principal surface side N$^+$ conductive type region 3$a$ (i.e., a principal N region) having a high impurity concentration and a principal surface side P$^+$ conductive type region 4$a$ (i.e., principal P region) having a high impurity concentration are formed on the surface portion of the P conductive type region 2$a$. The principal P region 4$a$ is formed by a diffusion method such that the principal P region 4$a$ does not reach the PN junction between the P conductive type region 2$a$ and the principal N region 3$a$. The principal P region 4$a$ is disposed near a gate electrode of the IGBT cell 100$i$.

A backside surface P$^+$ conductive type region 5 (i.e., backside P region) having a high impurity concentration and a backside surface N$^+$ conductive type region 6 (i.e., backside N region) having a high impurity concentration are formed in a surface portion of the substrate 1 on the backside surface. It is preferred that the principal P region 4$a$ is adjacent to the principal N region 3$a$. In this case, arrangement of the IGBT cell 100$i$ and the diode cell 100$d$ has high arrangement density, compared with a case where the principal P region 4$a$ is disposed apart from the principal N region 3$a$. Thus, dimensions of the device 100 are reduced, so that the device 100 is minimized.

A first trench T1 is formed in the device 100. The first trench T1 penetrates the principal N region 3$a$ and the P conductive type layer 2$a$, and reaches the substrate 1. Further, a second trench T2 is formed in the device 100. The second trench T2 penetrates the principal P region 4$a$, and reaches the inside of the P conductive type region 2$a$. The second trench T2 also penetrates the principal N region 3$a$. In this case, the IGBT cell 100$i$ and the diode cell 100$d$ are arranged with high arrangement density so that the device 100 is minimized, compared with a case where the second trench T2 is formed on another position without penetrating the principal N region 3$a$.

A first electrode layer 8 made of poly silicon or the like is embedded in the first trench T1 through an insulation film 7, which is formed on an inner wall of the first trench T1. The first electrode layer 8 provides a gate electrode of the IGBT cell 100$i$.

A second electrode layer 10 made of aluminum or the like is formed on the principal surface of the substrate 1 through an interlayer insulation film 9. The second electrode layer 10 is also embedded in the second trench T2. The second electrode layer 10 is electrically coupled with the P conductive type region 2$a$ through the principal N region 3$a$ and the principal P region 4$a$. The second electrode layer 10 provides an emitter electrode of the IGBT cell 100$i$ and an anode electrode of the diode cell 100$d$. The second electrode layer 10 is also connected to the principal N region 3$a$ and the principal P region 4$a$ so that they are short-circuited by the second electrode layer 10. Accordingly, the emitter and the channel in the IGBT cell 100$i$ are electrically shorted, and the potential of the channel is fixed. Thus, the operation of the IGBT cell 100$i$ is stabilized.

In the device 100, a third electrode layer 11 is formed on the backside surface of the substrate 1. The third electrode layer 11 electrically connects the backside P region 5 and the backside N region 6 so that they are short-circuited. The third electrode layer 11 provides a cathode electrode of the diode cell 100$d$ and a collector electrode of the IGBT cell 100$i$.

In the device 100, the P conductive type layer 2a is formed in the surface portion of the principal surface of the substrate 1, and has the impurity concentration, which is gradually reduced from the surface portion toward the inside of the substrate 1. The P conductive type layer 2a forms the channel forming layer of the IGBT cell 100 and the P conductive type portion of the diode cell 100d. The structure of the IGBT cell 100i in the device 100 is a general structure of an IGBT cell, so that the IGBT cell 100i has general characteristics.

In the device having the IGBT cell 100i and the diode cell 100d, which are formed in the same substrate 1, the principal N region 3a, the P conductive type layer 2a and the N conductive type semiconductor substrate 1 provide a parasitic NPN transistor. This parasitic NPN transistor has a general structure as a general parasitic NPN transistor. Accordingly, the surge withstand voltage of the device 100 is sufficient.

In the device 90 shown in FIG. 8, the second electrode layer 10 as the anode electrode of the diode cell 90d is electrically connected to the P conductive type layer 2 through the principal P region 4 on the surface portion of the substrate 1. However, in the device 100 shown in FIG. 1, the second electrode layer 10 embedded in the second trench T2 and reaching the inside of the P conductive type layer 2a provides the anode electrode of the diode cell 100d, and the second electrode layer 10 is electrically connected to the P conductive type layer 2a. The inside of the P conductive layer 2a has an impurity concentration, which is lower than that of the surface portion. Accordingly, in the device 100, an introduced hole concentration in case of the forward operation of the diode cell 100i is reduced, compared with the device 90. Thus, the recovery current Irr of the diode cell 100d in case of a reverse recovery process becomes small, and the recovery loss is also reduced. Thus, the recovery performance of the diode cell 100d is improved.

The device 100 has sufficient IGBT characteristics, sufficient recovery characteristics of the diode cell 100d, and sufficient surge withstand characteristics.

Further, in the device 100, the principal P region 4a is formed in the surface portion of the P conductive type layer 2a, and the second trench T2 penetrates the principal P region 4a. Further, the second electrode layer 10 is electrically connected to the principal P region 4a on the sidewall of the second trench T2. The connection between the second electrode layer 10 and the principal P region 4a provides ohmic contact. The impurity concentration of the principal P region 4a is, for example, equal to or larger than $1 \times 10^{19}$ cm$^{-3}$, so that the principal P region 4a and the emitter electrode have excellent ohmic contact.

In the device 100, the second electrode layer 10 as the emitter of the IGBT cell 100i is connected to the principal P region 4a. Accordingly, the electric potential of the P conductive type layer 2a as the channel forming layer of the IGBT cell 100i is surely fixed. Specifically, the pinch resistance of the P conductive type layer 2a is reduced by forming the principal P region 4a. Thus, operation of the parasitic NPN transistor is prevented, so that the surge withstand voltage is improved. Further, the second electrode layer 10 as the anode electrode of the diode cell 100d is connected to the principal P region 4a on the sidewall of the second trench T2, and the second electrode layer 10 is connected to the inside of the P conductive type layer 2a at a top end of the second trench T2. Accordingly, even when the principal P region 4a is formed in the device 100, the recovery performance of the diode cell 100d is not reduced.

Further, in the device 100, the impurity concentration of the P conductive type layer 2a is reduced from the surface portion toward the inside, and the P conductive type layer 2a may be formed by a single diffusion method so that the P conductive type layer 2a has a single layer structure. Alternatively, the P conductive type layer 2a may be formed by a double diffusion method so that the P conductive type layer 2a has a double layer structure, which includes a high impurity concentration layer 2ah and a low impurity concentration layer 2al. The high impurity concentration layer 2ah is disposed on a surface side of the P conductive type layer 2a, and the low impurity concentration layer 2al is disposed on an inside of the P conductive type layer 2a. In FIG. 1, the P conductive type layer 2a has the high impurity concentration layer 2ah and the low impurity concentration layer 2al. In this case, the second trench T2 reaches the low impurity concentration layer 2al so that the second electrode layer 10 is electrically connected to the low impurity concentration layer 2al.

Since the P conductive type layer 2a has the double layer structure, the impurity concentration of the high impurity concentration layer 2ah and the impurity concentration of the low impurity concentration layer 2al are independently controllable. Thus, the impurity concentration of the high impurity concentration layer 2ah can be determined appropriately so that a threshold voltage of the channel region of the IGBT cell 100i is set to be a predetermined voltage. Further, the impurity concentration of the low impurity concentration layer 2al can be determined appropriately so that the recovery current of the diode cell 100d is reduced appropriately. Accordingly, interference between the IGBT cell 100i and the diode cell 100d in the device 100 is reduced by the double layer structure of the P conductive type layer 2a. The characteristics of the IGBT cell 100i and the characteristics of the diode cell 100d are controlled individually and easily.

Next, simulation result of the current flowing in the diode cell 100d is explained when the device 100 is used for an inverter circuit and the diode cell 100d is used for a free wheel diode (i.e., FWD).

Figure 2A:
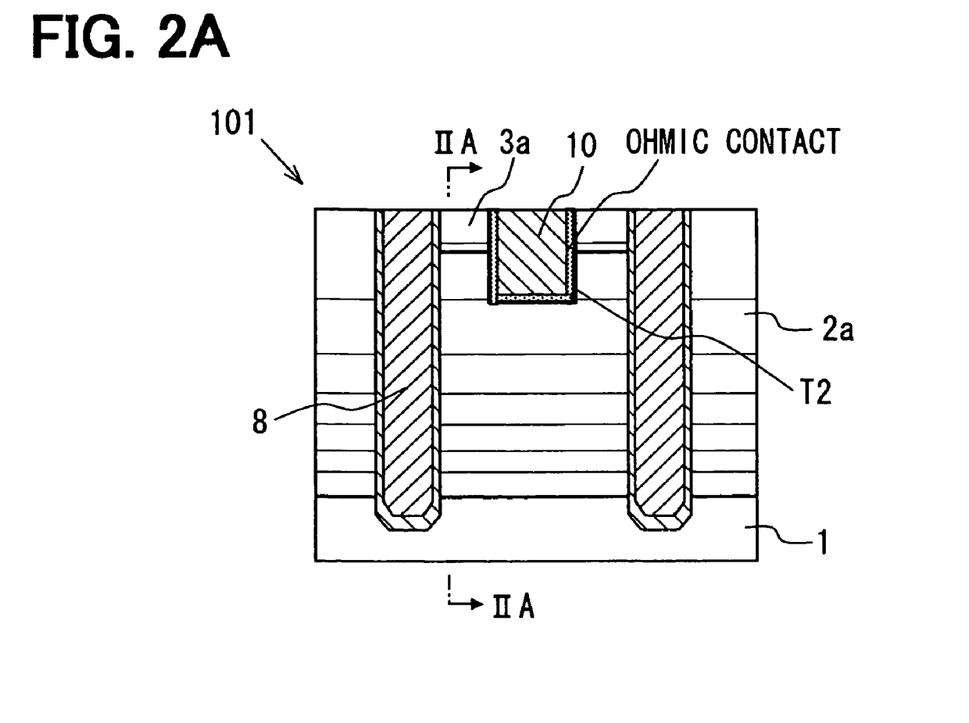
FIGS. 2A and 2B are cross sectional views showing semiconductor devices, which are used for simulation.
Figure 2B:
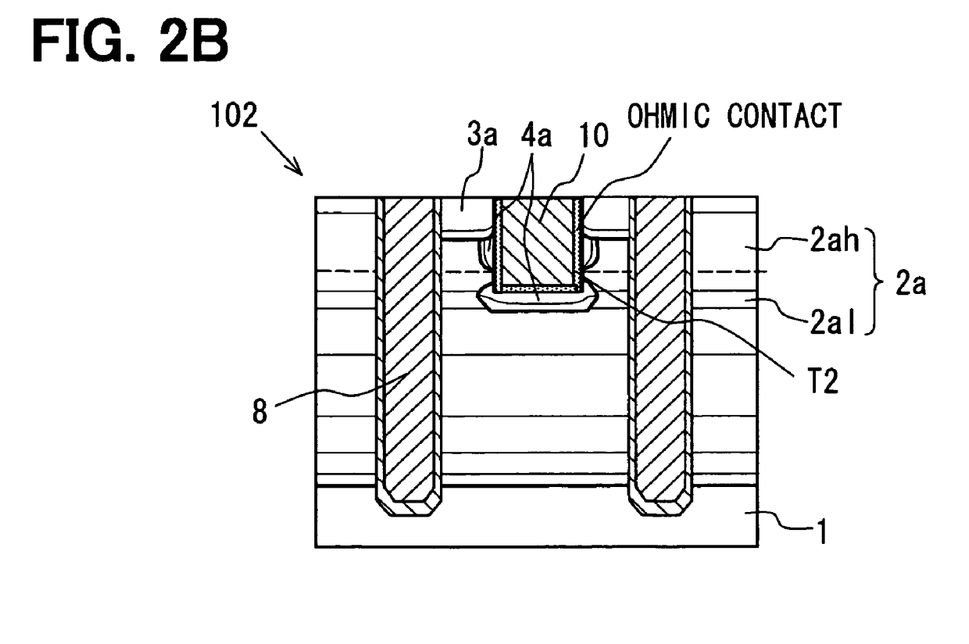
Figure 3A:
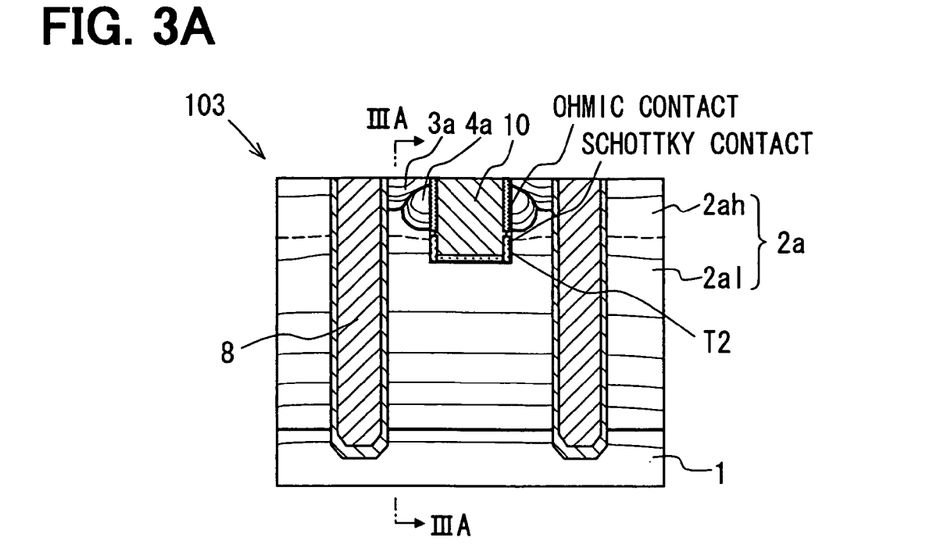
FIG. 3A is a cross sectional view showing another semiconductor device, which is used for simulation.
Figure 3B:
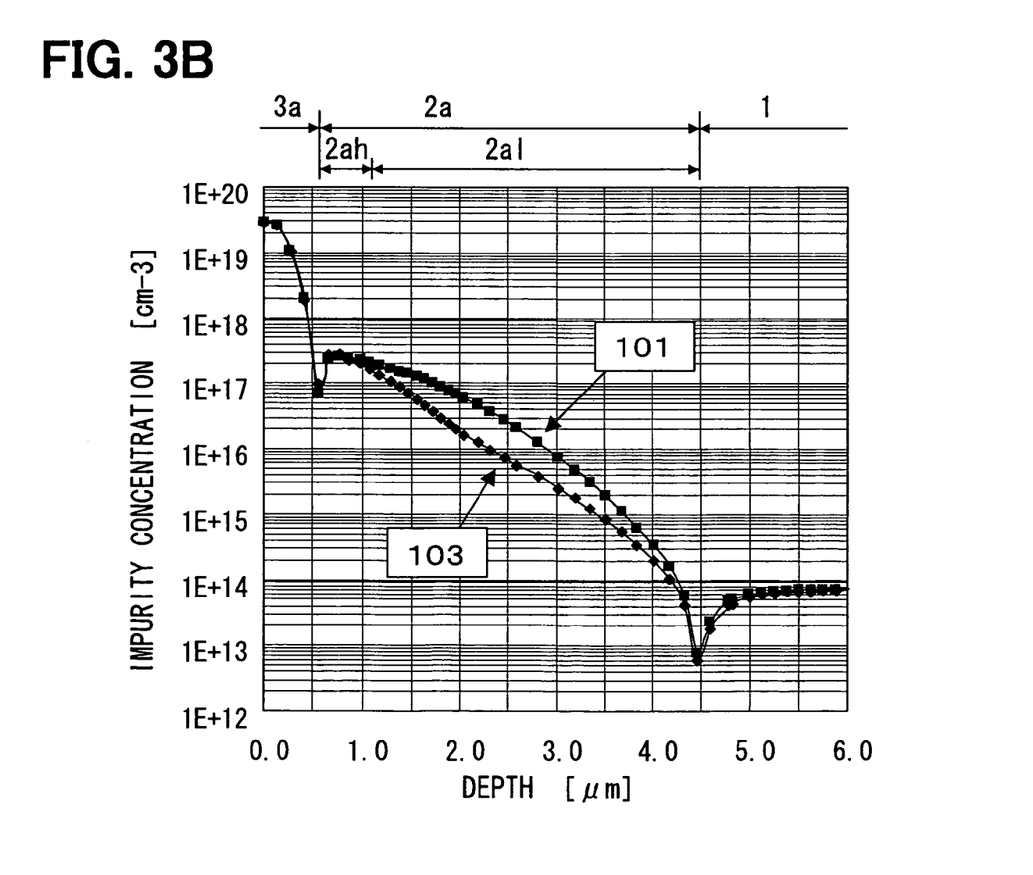
FIG. 3B is a graph showing a depth profile of impurity concentration in the devices shown in FIGS. 2A and 3A.

FIGS. 2A and 2B show two different semiconductor devices 101, 102, which are used for the simulation. FIGS. 2A and 2B show equivalent concentration lines of the impurity concentration in each layer of the devices 101, 102. FIG. 3A shows another semiconductor device 103, which is used for the simulation. FIG. 3B shows depth profile of the impurity concentration in the devices 101, 103 taken along lines IIA-IIA in FIG. 2A and IIIA-IIIA in FIG. 3A.

The device 101 has a simple structure compared with the device 100, and the P conductive type layer 2a has the single layer structure, and the principal P region 4a is not formed around the second trench T2. The P conductive type layer 2a and the second electrode layer 10 in the second trench T2 are electrically connected each other with ohmic contact on whole contact area therebetween. Further, the principal N region 3a and the second electrode layer 10 in the second trench T2 are also electrically connected each other with ohmic contact on whole contact area therebetween.

In the device 102, the P conductive type layer 2a has the double layer structure including the low impurity concentration layer 2al and the high impurity concentration layer 2ah. Further, the principal P region 4a is also formed on a top end of the second trench T2. The low impurity concentration layer 2al and the high impurity concentration layer 2ah of the P conductive type layer 2a and the second electrode layer 10 in the second trench T2 are electrically connected each other with ohmic contact on whole contact area therebetween. Further, the principal N region 3a and the second electrode layer 10 in the second trench T2 are also electrically connected each other with ohmic contact on whole contact area therebetween.

The device 103 has a similar structure as the device 100. In the device 103, the P conductive type layer 2a has the double layer structure including the low impurity concentration layer 2al and the high impurity concentration layer 2ah. The second electrode layer 10 in the second trench T2 is connected to the low impurity concentration layer 2al at a top end of the second trench T2. Here, the impurity concentration of the low impurity concentration layer 2al is comparatively low, so that the electric connection between the low impurity concentration layer 2al and the second electrode layer 10 in the second trench T2 near the top end of the second trench T2 provides a Schottky contact. Further, the principal P region 4a is formed to be adjacent to the principal N region 3a, and the electric connection between the principal P region 4a and the second electrode layer 10 in the second trench T2 on the sidewall of the second trench T2 provides an ohmic contact. Further, the electric connection between the principal N region 3a and the second electrode layer 10 in the second trench T2 on the sidewall of the second trench T2 also provides an ohmic contact.

Figure 4:
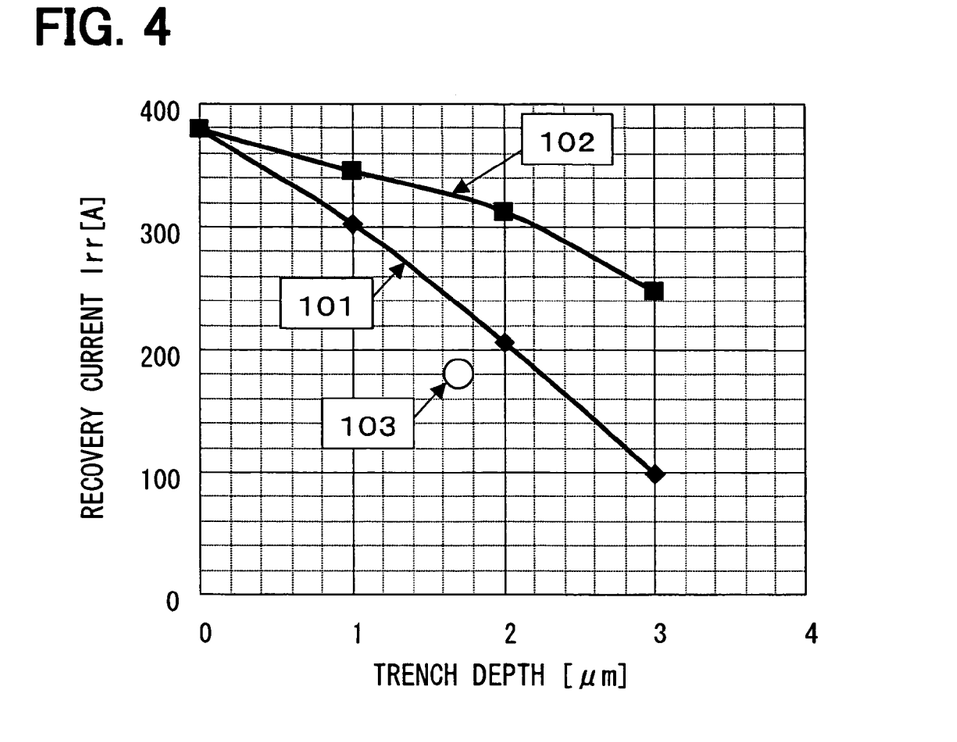
FIG. 4 is a graph showing a relationship between a recovery current of a diode cell and a depth of a second trench in the devices shown in FIGS. 2A-2B and 3A.
Figure 5:
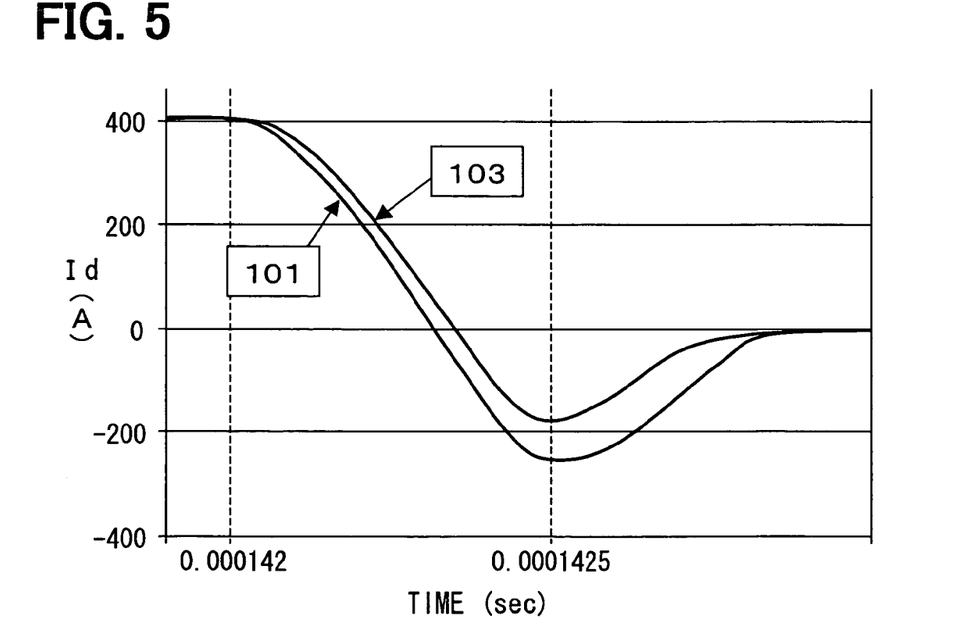
FIG. 5 is a graph showing a relationship between a time and a current of the diode cell in the devices shown in FIGS. 2A and 3A.

FIG. 4 shows a relationship between a trench depth of the second trench T2 and a recovery current Irr of the diode cell in each device 101, 102, 103 obtained by the simulation result. FIG. 5 shows a current waveform of the diode cell in each device 101, 103 obtained by the simulation result. In FIG. 5, the recovery current Irr of the device 101 having the single diffusion channel structure is 253 amperes obtained by the simulation result, and the recovery current Irr of the device 103 having the double diffusion channel structure is 180 amperes obtained by the simulation result.

In FIG. 4, a case where the second trench T2 has a depth of zero, i.e., the device 101, 102 has no second trench T2, corresponds to the device 90 shown in FIG. 8. In this case, the recovery current Irr is 380 amperes.

In the device 101 having the single layer structure of the P conductive type layer 2a and having the ohmic contact between the P conductive type layer 2a and the second electrode layer 10 on the whole contact area therebetween, the recovery current Irr is reduced as the depth of the second trench T2 becomes deeper. For example, when the depth of the second trench T2 is 1.7 μm, the recovery current Irr is 240 amperes, which is much smaller than the device 90.

In the device 102 having the double layer structure of the P conductive type layer 2a and having the principal P region 4a formed on the top end of the second trench T2, the recovery current Irr is also reduced as the depth of the second trench T2 becomes deeper. Here, reduction rate of the recovery current Irr in the device 102 is smaller than that of the device 101. For example, when the depth of the second trench T2 is 1.7 μm, the recovery current Irr is 330 amperes, which is smaller than the device 90.

In the device 103 having the double layer structure of the P conductive type layer 2a and having the second electrode layer 10 in the second trench T2 contacting the low impurity concentration layer 2al with Schottky contact at the top end of the second trench T2, the reduction of the recovery current Irr becomes maximum. For example, when the depth of the second trench T2 is 1.7 μm, the recovery current Irr is 180 amperes, which is much smaller than the device 90.

Thus, the impurity concentration of the P conductive type layer 2a connecting to the second electrode layer 10 at the top end of the second trench T2 is preferably lower in order to reduce the recovery current of the diode cell.

It is preferred that the electric connection between the P conductive type layer 2a and the second electrode layer 10 at the top end of the trench T2 is Schottky contact. In general, the Schottky contact provides rectification function, so that only the electron stream is performed when the diode flows the current in a forward direction. Thus, the hole introduction from an ohmic contact portion is reduced. Accordingly, the hole is removed by the Schottky contact in case of recovery process. As a result, the recovery characteristics are improved. Thus, the electric connection between the second electrode layer 10 and the P conductive type layer 2a at the top end of the second trench T2 as a main part of the anode electrode in the diode cell provides the Schottky contact having the rectification action. Accordingly, the recovery current in case of the reverse recovery process becomes smaller than a case where the whole connection is provided by the ohmic contact. Thus, the recovery loss is reduced, and the recovery characteristics are improved.

Figure 6:
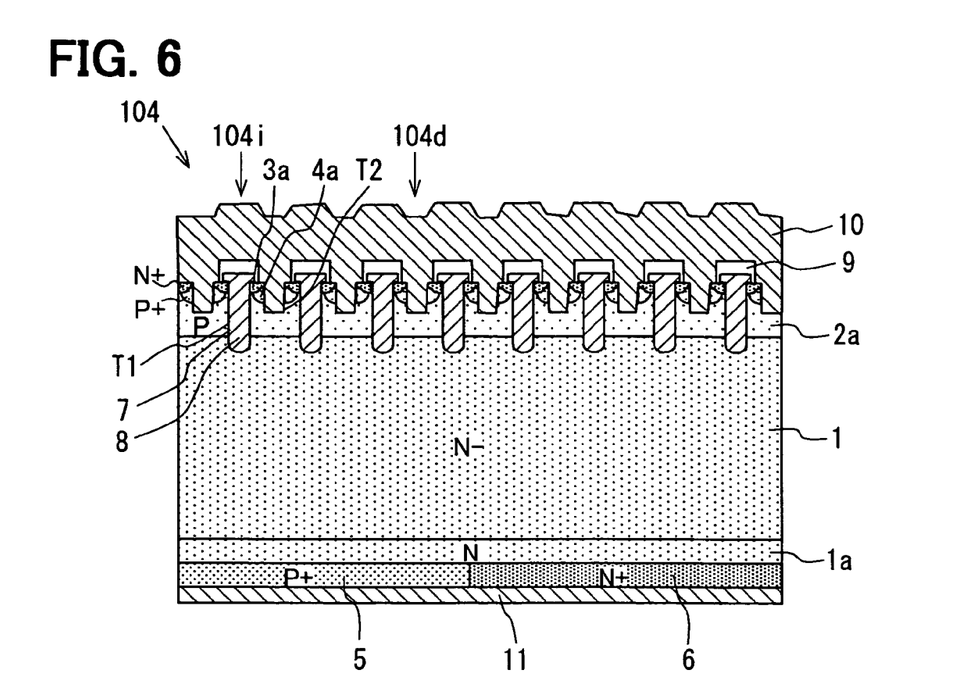
FIG. 6 is a cross sectional view showing another semiconductor device according to a modification of the preferred embodiment of the present disclosure.

FIG. 6 shows another semiconductor device 104 according to a modification of the preferred embodiment.

The device 104 includes an IGBT cell 104i and a diode cell 104d, which are formed in the substrate 1. The device 104 includes a backside N conductive type layer 1a (i.e., backside N layer), which is formed on the backside P region 5 and the backside N region 6 in the substrate 1 so that the backside N layer 1a covers the backside P region 5 and the backside N region 6. The impurity concentration of the backside N layer 1a is between the impurity concentrations of the substrate 1 and the backside N region 6. The backside N layer 1a is a field stop layer for preventing punch through effect in a depletion layer extending from the principal surface portion of the P conductive layer 2a and the backside P region 5 to the substrate 1. Thus, the device 104 has high breakdown voltage.

Figure 7:
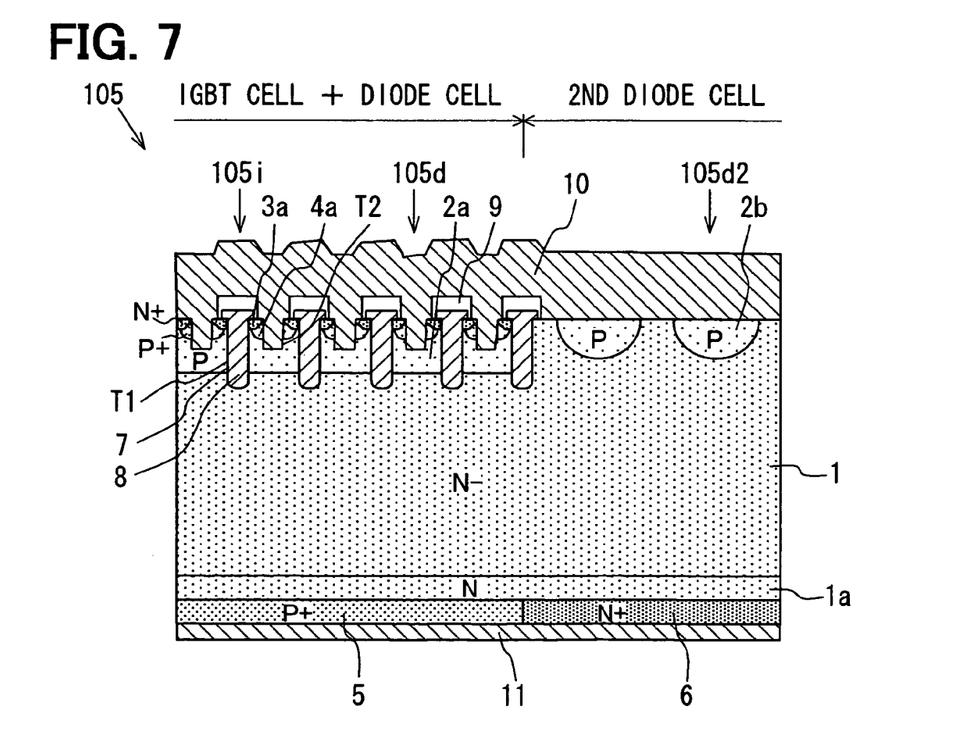
FIG. 7 is a cross sectional view showing further another semiconductor device according to another modification of the preferred embodiment of the present disclosure.

FIG. 7 shows further another semiconductor device according to another modification of the preferred embodiment. The device 105 includes an IGBT cell 105i and a diode cell 105d, which are formed in the substrate 1. Further, the device 105 includes the backside N conductive type layer 1a, which is formed on the backside P region 5 and the backside N region 6 in the substrate 1 so that the backside N layer 1a covers the backside P region 5 and the backside N region 6.

In the device 105, a second principal surface side P conductive type region 2b is formed on the principal surface portion of the substrate 1, which is disposed in a region having no P conductive type region 2a other than the diode cell 105d. The second electrode layer 10 is electrically connected not only to the P conductive type region 2a but also to the second principal surface side P conductive type region 2b. Accordingly, the device 105 further includes a second diode cell 105d2, which is provided by the second principal surface side P conductive type region 2b, the substrate 1 and the backside N region 6. In the second diode cell 105d2, the second electrode layer 10 provides an anode electrode, and the third electrode layer 11 provides a cathode electrode. The second diode cell 105d2 is adjacent to the diode cell 105d, which is a first diode cell.

In each device 100, 104 shown in FIGS. 1 and 6, the diode cell 100i, 104i is formed by the P conductive type layer 2a and the N conductive type semiconductor substrate 1 and the backside surface N conductive type region 6. This diode cell 100i, 104i provides a body diode cell. Although the recovery characteristics of the body diode cell 100i, 104i are improved, the current capacity of the diode cell 100i, 104i becomes small, compared with the diode cell 90d in the device 90 having no second trench T2 and the anode electrode 10 connecting near the surface portion of the substrate 1.

In the device 105 shown in FIG. 7, the second diode cell 105d2 is formed on a portion of the substrate 1 other than a portion of the substrate 1, on which the first diode cell 105d is formed. This second diode cell 105d2 provides sufficient current capacity. In the second diode cell 105d2, the anode electrode 10 is electrically connected to the second principal surface side P conductive type region 2b. However, the second principal surface side P conductive type region 2b can be formed apart from the IGBT cell 105, and further, the impurity concentration of the second principal surface side P conductive type region 2b is controlled appropriately. Thus, the recovery characteristics are improved.

In the device 105, the backside P region 5 is formed under the P conductive type layer 2a, and the backside N region 6 is formed under the second principal surface side P conductive type region 2b. Thus, diode performance of the first diode cell 105d is reduced so that the first diode cell 105d together with the IGBT cell 105i mainly functions as an IGBT, and the second diode cell 105d2 functions as a main diode. Thus, since the IGBT function part (i.e., the IGBT cell 105i with the diode cell 105d) and the diode function part (i.e., the second diode cell 105d2) are clearly separated from each other, a designing degree of freedom in the device 105 increases, and the design of the device 105 is easily performed.

In each device 100-150 shown in FIGS. 1-7, the P conductive type layer 2a is formed on the N conductive type semiconductor substrate 1, and the N channel IGBT cell 100i-105i and the diode cell 100d-105d having the P conductive type layer 2a as the anode are formed. Alternatively, an N conductive type layer may be formed on a P conductive type semiconductor substrate, and a P channel IGBT cell and a diode cell having the N conductive type layer as a cathode may be formed. In this case, the device has sufficient IGBT performance, sufficient recovery performance and sufficient surge withstand performance.

The above devices 100-150 are suitably used for an inverter circuit, and the first and second diode cells are suitably used as FWD.

The above disclosure has the following aspects.

According to a first aspect of the present disclosure, a semiconductor device includes: a substrate having a first side and a second side; an IGBT disposed in the substrate; and a diode disposed in the substrate. The substrate includes a first layer having a first conductive type, a second layer having a second conductive type, a first side first conductive type region, a second side first conductive type region and a second side second conductive type region. The second layer is disposed on the first side of the first layer, and has an impurity concentration, which is reduced from the first side of the second layer to the second side of the second layer. The first side first conductive type region is disposed on the first side of the second layer. The second side first conductive type region and the second side second conductive type region are disposed on the second side of the first layer. The second side first conductive type region is adjacent to the second side second conductive type region. The substrate further includes a first trench, a second trench, a first electrode, a second electrode and a third electrode. The first electrode is embedded in the first trench through an insulation film. The first trench penetrates the first side first conductive type region and the second layer, and reaches the first layer. The first electrode provides a gate electrode of the IGBT. The second electrode is disposed on the first side first conductive type region so that the second electrode is electrically coupled with the first side first conductive type region. The second trench penetrates the first side first conductive type region, and reaches the second layer. The second trench is filled with the second electrode so that the second electrode is electrically coupled with the second layer. The second electrode provides an emitter electrode of the IGBT and an anode electrode of the diode. The third electrode is disposed on the second side first conductive type region and the second side second conductive type region so that the third electrode is electrically coupled with the second side first conductive type region and the second side second conductive type region. The third electrode provides a collector electrode of the IGBT and a cathode of the diode.

In the above device, the second layer provides a channel of the IGBT and a P conductive portion of the diode. The device has sufficient IGBT performance and sufficient surge withstand voltage. Further, the second layer connecting to the anode of the diode has the impurity concentration, which is reduced from the surface portion to the inside of the second layer. Thus, an introduced hole concentration is reduced in case of forward operation, so that a recovery current in case of reverse recovery process becomes small. Thus, the recovery loss in the device is reduced so that the recovery characteristics are improved.

Alternatively, the substrate may further include a first side second conductive type region, which is disposed between the second layer and the first side first conductive type region, and the second trench penetrates the first side second conductive type region so that the second electrode in the second trench is electrically coupled with the first side second conductive type region. Further, the second electrode may be coupled with the first side second conductive type region with ohmic contact. Alternatively, the first side second conductive type region may contact the first side first conductive type region. In the above cases, the electric potential of the second layer as the channel of the IGBT is surely fixed, so that the pinch resistance of the second layer is reduced. Thus, the parasitic NPN transistor is prevented from operating, so that the surge withstand voltage is improved. Further, the device has sufficient recovery characteristics of the diode, since the second electrode as the anode electrode of the diode is connected to the first side second conductive type region on the sidewall of the second trench, and connected to the inside of the second layer at a top end of the second trench.

Alternatively, the second electrode may be coupled with the second layer with Schottky contact. The Schottky contact has rectification function so that the Schottky contact provides to reduce the introduction of the hole from the ohmic contact area. Thus, the recovery characteristics of the diode are improved.

Alternatively, the second layer may include a high impurity concentration layer and a low impurity concentration layer. The high impurity concentration layer is disposed on the first side of the second layer, and the low impurity concentration layer is disposed on the second side of the second layer. The second trench penetrates the high impurity concentration layer, and reaches the low impurity concentration layer. The second electrode is electrically coupled with the low impurity concentration layer. In this case, the impurity concentration of the high impurity concentration layer is appropriately determined in order to set the threshold voltage of the channel in the IGBT, and the impurity concentration of the low impurity concentration layer is appropriately determined in order to reduce the recovery current of the diode. Thus, characteristics controls of the IGBT and the diode are easily and independently performed.

Alternatively, the device may further include: a second diode disposed in the substrate. The second diode is adjacent to the diode. In the second diode, the second electrode, the first layer, the second side first conductive type region and the third electrode are stacked in this order. The first layer in the second diode cell further includes a second conductive type portion, which is disposed in a surface portion of the first layer on the first side. The second electrode is electrically coupled with the second conductive type portion. The second electrode provides an anode electrode of the second diode. The third electrode provides a cathode electrode of the second diode. In this case, the second diode provides sufficient current capacity.

Alternatively, the second side first conductive type region may be disposed in the diode, and the second side second conductive type region may be disposed in the IGBT. Alternatively, the second side first conductive type region may be disposed in the second diode, and the second side second conductive type region may be disposed in the IGBT and the diode.

Alternatively, the second side first conductive type region may be disposed under the second conductive type portion, and the second side second conductive type region may be disposed under the second layer. In this case, the design degree of freedom in the device is improved.

Alternatively, the substrate may further include a third layer having the first conductive type. The third layer is disposed between the first layer and the second side first conductive type region and between the first layer and the second side second conductive type region. The third layer covers the second side first conductive type region and the second side second conductive type region. The third layer has an impurity concentration, which is disposed between an impurity concentration of the first layer and an impurity concentration of the second side first conductive type region.

Alternatively, the IGBT and the diode may provide an inverter circuit, and the diode provides a free wheel diode.

Alternatively, the IGBT, the diode and the second diode may provide an inverter circuit, the diode provides a free wheel diode, and the second diode provides a second free wheel diode.

According to a second aspect of the present disclosure, a semiconductor device includes: a substrate having a first side and a second side; an IGBT disposed in the substrate; and a diode disposed in the substrate. The substrate includes a first layer having a first conductive type, a second layer having a second conductive type, a first side first conductive type region, a second side first conductive type region and a second side second conductive type region. The second layer is disposed on the first side of the first layer, and has an impurity concentration, which is reduced from the first side of the second layer to the second side of the second layer. The first side first conductive type region is disposed on the first side of the second layer. The second side first conductive type region and the second side second conductive type region are disposed on the second side of the first layer. The second side first conductive type region is adjacent to the second side second conductive type region. The substrate further includes a first trench, a second trench, a first electrode, a second electrode and a third electrode. The first electrode is embedded in the first trench through an insulation film. The first trench penetrates the first side first conductive type region and the second layer, and reaches the first layer. The first electrode provides a gate electrode of the IGBT. The second electrode is disposed on the first side first conductive type region so that the second electrode is electrically coupled with the first side first conductive type region. The second trench penetrates the first side first conductive type region, and reaches the second layer. The second trench is filled with the second electrode so that the second electrode is electrically coupled with the second layer. The second electrode provides an emitter electrode of the IGBT and a cathode electrode of the diode. The third electrode is disposed on the second side first conductive type region and the second side second conductive type region so that the third electrode is electrically coupled with the second side first conductive type region and the second side second conductive type region. The third electrode provides a collector electrode of the IGBT and an anode of the diode.

In the above device, the second layer provides a channel of the IGBT and an N conductive portion of the diode. The device has sufficient IGBT performance and sufficient surge withstand voltage. Further, the second layer connecting to the cathode of the diode has the impurity concentration, which is reduced from the surface portion to the inside of the second layer. Thus, an introduced hole concentration is reduced in case of forward operation, so that a recovery current in case of reverse recovery process becomes small. Thus, the recovery loss in the device is reduced so that the recovery characteristics are improved.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a substrate having a first side and a second side;
an IGBT disposed in the substrate; and
a diode disposed in the substrate, wherein
the substrate includes a first layer having a first conductive type, a second layer having a second conductive type, a first side first conductive type region, a second side first conductive type region and a second side second conductive type region,
the second layer is disposed on the first side of the first layer, and has an impurity concentration, which is reduced from the first side of the second layer to the second side of the second layer,
the first side first conductive type region is disposed on the first side of the second layer,
the second side first conductive type region and the second side second conductive type region are disposed on the second side of the first layer,
the second side first conductive type region is adjacent to the second side second conductive type region,
the substrate further includes a first trench, a second trench, a first electrode, a second electrode and a third electrode,
the first electrode is embedded in the first trench through an insulation film,
the first trench penetrates the first side first conductive type region and the second layer, and reaches the first layer,
the first electrode provides a gate electrode of the IGBT,
the second electrode is disposed on the first side first conductive type region so that the second electrode is electrically coupled with the first side first conductive type region,
the second trench penetrates the first side first conductive type region, and reaches the second layer,
the second trench is filled with the second electrode so that the second electrode is electrically coupled with the second layer,
the second electrode provides an emitter electrode of the IGBT and an anode electrode of the diode,
the third electrode is disposed on the second side first conductive type region and the second side second conductive type region so that the third electrode is electrically coupled with the second side first conductive type region and the second side second conductive type region, and the third electrode provides a collector electrode of the IGBT and a cathode of the diode.

2. The device according to claim 1, wherein
the substrate further includes a first side second conductive type region, which is disposed between the second layer and the first side first conductive type region, and
the second trench penetrates the first side second conductive type region so that the second electrode in the second trench is electrically coupled with the first side second conductive type region.

3. The device according to claim 2, wherein
the second electrode is coupled with the first side second conductive type region with ohmic contact.

4. The device according to claim 2, wherein
the first side second conductive type region contacts the first side first conductive type region.

5. The device according to claim 1, wherein
the second electrode is coupled with the second layer with Schottky contact.

6. The device according to claim 1, wherein
the second layer includes a high impurity concentration layer and a low impurity concentration layer,
the high impurity concentration layer is disposed on the first side of the second layer, and the low impurity concentration layer is disposed on the second side of the second layer,
the second trench penetrates the high impurity concentration layer, and reaches the low impurity concentration layer, and
the second electrode is electrically coupled with the low impurity concentration layer.

7. The device according to claim 1, further comprising:
a second diode disposed in the substrate, wherein
the second diode is adjacent to the diode,
in the second diode, the second electrode, the first layer, the second side first conductive type region and the third electrode are stacked in this order,
the first layer in the second diode further includes a second conductive type portion, which is disposed in a surface portion of the first layer on the first side,
the second electrode is electrically coupled with the second conductive type portion,
the second electrode provides an anode electrode of the second diode, and
the third electrode provides a cathode electrode of the second diode.

8. The device according to claim 1, wherein
the second side first conductive type region is disposed in the diode, and
the second side second conductive type region is disposed in the IGBT.

9. The device according to claim 7, wherein
the second side first conductive type region is disposed in the second diode, and
the second side second conductive type region is disposed in the IGBT and the diode.

10. The device according to claim 7, wherein
the second side first conductive type region is disposed under the second conductive type portion, and
the second side second conductive type region is disposed under the second layer.

11. The device according to claim 1, wherein
the substrate further includes a third layer having the first conductive type,
the third layer is disposed between the first layer and the second side first conductive type region and between the first layer and the second side second conductive type region,
the third layer covers the second side first conductive type region and the second side second conductive type region, and
the third layer has an impurity concentration, which is disposed between an impurity concentration of the first layer and an impurity concentration of the second side first conductive type region.

12. The device according to claim 1, wherein
the IGBT and the diode provide an inverter circuit, and
the diode provides a free wheel diode.

13. The device according to claim 7, wherein
the IGBT, the diode and the second diode provide an inverter circuit,
the diode provides a free wheel diode, and
the second diode provides a second free wheel diode.

14. A semiconductor device comprising:
a substrate having a first side and a second side;
an IGBT disposed in the substrate; and
a diode disposed in the substrate, wherein
the substrate includes a first layer having a first conductive type, a second layer having a second conductive type, a first side first conductive type region, a second side first conductive type region and a second side second conductive type region,
the second layer is disposed on the first side of the first layer, and has an impurity concentration, which is reduced from the first side of the second layer to the second side of the second layer,
the first side first conductive type region is disposed on the first side of the second layer,
the second side first conductive type region and the second side second conductive type region are disposed on the second side of the first layer,
the second side first conductive type region is adjacent to the second side second conductive type region,
the substrate further includes a first trench, a second trench, a first electrode, a second electrode and a third electrode,
the first electrode is embedded in the first trench through an insulation film,
the first trench penetrates the first side first conductive type region and the second layer, and reaches the first layer,
the first electrode provides a gate electrode of the IGBT,
the second electrode is disposed on the first side first conductive type region so that the second electrode is electrically coupled with the first side first conductive type region,
the second trench penetrates the first side first conductive type region, and reaches the second layer,
the second trench is filled with the second electrode so that the second electrode is electrically coupled with the second layer,
the second electrode provides an emitter electrode of the IGBT and a cathode electrode of the diode,
the third electrode is disposed on the second side first conductive type region and the second side second conductive type region so that the third electrode is electrically coupled with the second side first conductive type region and the second side second conductive type region, and
the third electrode provides a collector electrode of the IGBT and an anode of the diode.

15. The device according to claim 14, wherein
the substrate further includes a first side second conductive type region, which is disposed between the second layer and the first side first conductive type region, and
the second trench penetrates the first side second conductive type region so that the second electrode in the second trench is electrically coupled with the first side second conductive type region.

16. The device according to claim 15, wherein
the second electrode is coupled with the first side second conductive type region with ohmic contact.

17. The device according to claim 15, wherein
the first side second conductive type region contacts the first side first conductive type region.

18. The device according to claim 14 wherein
the second electrode is coupled with the second layer with Schottky contact.

19. The device according to claim 14, wherein
the second layer includes a high impurity concentration layer and a low impurity concentration layer,
the high impurity concentration layer is disposed on the first side of the second layer, and the low impurity concentration layer is disposed on the second side of the second layer,
the second trench penetrates the high impurity concentration layer, and reaches the low impurity concentration layer, and
the second electrode is electrically coupled with the low impurity concentration layer.

20. The device according to claim 14, further comprising:
a second diode disposed in the substrate, wherein
the second diode is adjacent to the diode,
in the second diode, the second electrode, the first layer, the second side first conductive type region and the third electrode are stacked in this order,
the first layer in the second diode further includes a second conductive type portion, which is disposed in a surface portion of the first layer on the first side,
the second electrode is electrically coupled with the second conductive type portion,
the second electrode provides a cathode electrode of the second diode, and
the third electrode provides an anode electrode of the second diode.

21. The device according to claim 14, wherein
the second side first conductive type region is disposed in the diode, and
the second side second conductive type region is disposed in the IGBT.

22. The device according to claim 20, wherein
the second side first conductive type region is disposed in the second diode, and
the second side second conductive type region is disposed in the IGBT and the diode.

23. The device according to claim 20, wherein
the second side first conductive type region is disposed under the second conductive type portion, and
the second side second conductive type region is disposed under the second layer.

24. The device according to claim 14, wherein
the substrate further includes a third layer having the first conductive type,
the third layer is disposed between the first layer and the second side first conductive type region and between the first layer and the second side second conductive type region,
the third layer covers the second side first conductive type region and the second side second conductive type region, and
the third layer has an impurity concentration, which is disposed between an impurity concentration of the first layer and an impurity concentration of the second side first conductive type region.

25. The device according to claim 14, wherein
the IGBT and the diode provide an inverter circuit, and
the diode provides a free wheel diode.

26. The device according to claim 20, wherein
the IGBT, the diode and the second diode provide an inverter circuit,
the diode provides a free wheel diode, and
the second diode provides a second free wheel diode.

* * * * *